United States Patent [19]

Yanagi

[11] Patent Number: 5,299,155
[45] Date of Patent: Mar. 29, 1994

[54] DYNAMIC RANDOM ACCESS MEMORY DEVICE WITH CAPACITOR BETWEEN VERTICALLY ALIGNED FETS

[75] Inventor: Masahiko Yanagi, Osaka, Japan

[73] Assignee: Sharp Kabushiki Kaisha, Osaka, Japan

[21] Appl. No.: 84,442

[22] Filed: Jul. 1, 1993

Related U.S. Application Data

[63] Continuation of Ser. No. 841,522, Feb. 26, 1992, abandoned.

[30] Foreign Application Priority Data

Mar. 1, 1991 [JP] Japan ................... 3-34870

[51] Int. Cl.$^5$ ................... G11C 5/02; G11C 5/06
[52] U.S. Cl. ................... 365/149; 365/176; 257/66; 257/306; 257/309; 257/311
[58] Field of Search ............... 365/149, 176; 357/23.6; 257/66, 306, 309, 311

[56] References Cited

U.S. PATENT DOCUMENTS

| 4,642,878 | 2/1987 | Maeda . | |
|---|---|---|---|
| 4,922,312 | 5/1990 | Coleman et al. | 257/306 |
| 4,985,718 | 1/1991 | Ishijima | 257/306 |
| 5,012,310 | 4/1991 | Kimura et al. | 257/306 |
| 5,177,574 | 1/1993 | Yoneda | 257/306 |

FOREIGN PATENT DOCUMENTS

| 60-246670 | 12/1985 | Japan | 357/23.6 |
|---|---|---|---|
| 60-246671 | 12/1985 | Japan | 357/23.6 |

*Primary Examiner*—Joseph E. Clawson, Jr.
*Attorney, Agent, or Firm*—Nixon & Vanderhye

[57] ABSTRACT

A dynamic random access memory device for storing 2-bit information, including a memory cell having two access transistors and one capacitor, wherein one of the access transistors is composed of a thin film transistor and disposed above the other access transistor which is formed in a substrate; and the capacitor is sandwiched by the two access transistors.

2 Claims, 7 Drawing Sheets

DYNAMIC RANDOM ACCESS MEMORY DEVICE WITH CAPACITOR BETWEEN VERTICALLY ALIGNED FETS

This is a continuation of application Ser. No. 07/841,522, filed Feb. 26, 1992, now abandoned.

FIELD OF THE INVENTION

The present invention relates to a dynamic random access memory device and, more particularly to a MOS dynamic random access memory device (referred to as MOS DRAM, hereinbelow).

RELATED ART

MOS DRAMs are improving in integration density at a rate of four times larger in three years, and elements thereof are microscopically scaling down year after year. For assuring the reliability of highly miniaturized memory cells, there has been proposed a 2-bit memory cell provided with two access transistors and one capacitor [Japanese Unexamined patent Publications Nos. 16094/1991 and 297962/1990].

FIG. 6 shows an equivalent circuit of such a 2-bit memory cell, and Table 1 shows electric potential states at electrodes I and II in FIG. 6 depending on 2-bit data.

TABLE 1

| Data | D1 = H<br>D2 = H | D1 = H<br>D2 = L | D1 = L<br>D2 = H | D1 = L<br>D2 = L |
| --- | --- | --- | --- | --- |
| Electrode I | Vcc | 2/3 Vcc | 1/3 Vcc | GND |
| Electrode II | GND | 1/3 Vcc | 2/3 Vcc | Vcc |

In FIG. 6, designated by 1 is a word line, by 2 a bit line, by 3 an inversion bit line, by 4 a first transistor, by 5 a second transistor, by 6 an electrode I, by 7 an electrode II and by 8 a capacitor. FIG. 7 is a plan view showing a memory cell with both the two transistors being formed on a substrate; FIG. 8 is a sectional view of the memory cell in FIG. 7; FIG. 9 is a plan view showing a memory cell with one of the two transistors being composed of a thin film transistor; and FIG. 10 is a sectional view of the memory cell in FIG. 9. In these drawings, designated by 1 is a word line, by 2 a bit line, by 3 an inversion bit line, by 4 a first transistor, by 5 a second transistor, by 8 a memory capacitor, by 11 a contact hole, by 21 a N+diffusion layer, by 22 a gate oxide, by 23 a first insulating film, by 24 a second insulating film and by 27 a capacitor electrode.

The memory cell shown in FIG. 8 needs to have an area for providing a contact hole through which the top capacitor electrode 27 of polysilicon electrically connects to the drain region of the second transistor. Hence, the cell area cannot be made smaller, thus limiting improvement in integration density. In contrast the cell structure shown in FIG. 10 no longer needs to have a contact hole, so that the cell area can be reduced. Note that a gate oxide is designated by 29 and a polysilicon film is by 30.

In the cell structure shown in FIGS. 9 and 10, which employs a thin film transistor for one of the two access transistors, the two transistors are disposed substantially in a horizontal plane; e.g., the transistor in the substrate and the thin film transistor are placed merely in side-by-side relation, and furthermore a capacitor cannot be formed in a portion in which a word line and a bit line are superposed on each other.

For increasing the integration density, a memory cell area needs to be made the smallest possible. However, a capacitor electrode area needs to be maintained large enough to store information.

SUMMARY OF THE INVENTION

The present invention has been accomplished in view of the foregoing situation, and aims to provide an highly integrated DRAM in which a memory cell area occupying a substrate is highly reduced without decreasing a capacitor electrode area.

Thus, the present invention provides a dynamic random access memory device for storing 2-bit information, comprising a memory cell having two access transistors and one capacitor, wherein one of said access transistors is composed of a thin film transistor and disposed above the other transistor, while said other access transistor is formed in a substrate; and said capacitor is sandwiched by said two access transistors.

DETAILED DESCRIPTION OF THE PREFERRED EMBODIMENTS

Figure 1:
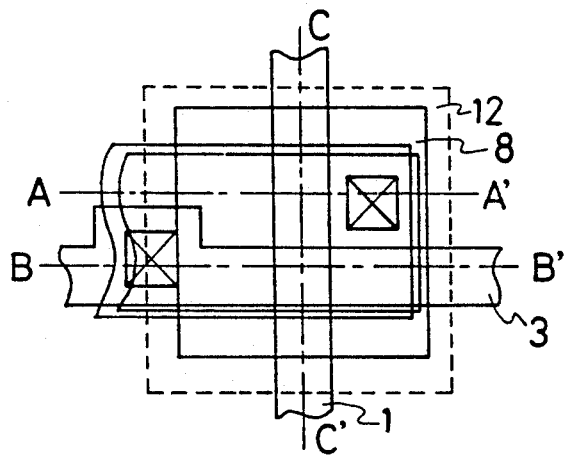
FIG. 1 is a plan view showing an embodiment of the present invention.

A memory cell constituting a DRAM of the present invention can be fabricated, for example, in the following manner.

First process (forming a first transistor section) comprises the steps of: forming a first insulating film on a Si substrate having therein a first transistor; forming a first contact hole in a predetermined region of the first insulating film; and forming an electric conductive film of a desired pattern on the first insulating film and in the first contact hole.

The first transistor can be formed by providing source/drain regions, a channel region and a word line on the channel region in accordance with a known method. The electric conductive film, which constitutes a bit line, may be made of polysilicon, polycide comprising polysilicon and tungsten silicide, or the like.

Second process (forming a capacitor section) comprises the steps of: forming a second insulating film on the first insulating film as well as on the first electric conductive film; forming a second contact hole extending through the second and first insulating films in a predetermined region of the second insulating film; forming a first capacitor electrode on a predetermined region of the second insulating film and in the second contact hole; and stacking on the first capacitor electrode a dielectric film and a second capacitor electrode in that order, completing a capacitor disposed above the first transistor.

The capacitor, consisting of the first capacitor electrode, dielectric film and second capacitor electrode, is formed above the first transistor, with the second insulating film or second and first insulating films being sandwiched therebetween. The first capacitor electrode, which electrically connects to a diffusion layer of the first transistor through the second contact hole, can be formed by doping, for example, a polysilicon layer with an impurity. The dielectric film may be composed of, for example, a silicon nitride or $Ta_2O_5$ film treated with oxidation. The second capacitor electrode can be formed in the same manner as with the first capacitor electrode.

Third process (forming a second transistor section) comprises the steps of: forming a third insulating film over the capacitor including the second capacitor electrode; forming a third contact hole in a predetermined region of the third insulating film; forming a stacked layer of polysilicon film and silicon oxide film on the third insulating film and in the third contact hole; implanting impurity ions into a predetermined region of the polysilicon film through the silicon oxide film to form a channel region of a second transistor; forming a second electric conductive layer on the channel region, followed by doping the polysilicon film on opposite sides of the channel region to form source/drain regions, thus completing the second transistor.

The second transistor, composed of a stacked structure of the polysilicon-silicon oxide films and the second electric conductive layer, is formed above the capacitor with sandwiching the third insulating film inbetween. The polysilicon film in which the channel and source/drain regions are formed can be formed from, for example, polysilicon obtained by crystallizing amorphous silicon. The second electric conductive layer constituting a word line can be formed from, for example, polysilicon doped with an impurity.

Fourth process (completing a memory cell) comprises the steps of: forming a fourth insulating film on the second transistor; forming a fourth contact hole in a predetermined region of the fourth insulating film; and forming a third electric conductive film on the fourth insulating film and in the fourth contact hole. Thus, a memory cell of a DRAM device of the present invention is completed.

The third electric conductive layer constitutes an inversion bit line and connects to a diffusion layer of the second transistor. This electric conductive layer is usually formed from a high-melting point metal such as titanium, tungsten or the like.

The DRAM device thus fabricated has a three-dimensional structure vertically stacking a transistor formed in the substrate, capacitor and a thin film transistor, hence leading to device scaling without reducing the capacitor area.

EXAMPLE

An example of the invention will hereinbelow be described in greater detail with reference to the drawings.

Figure 2A:
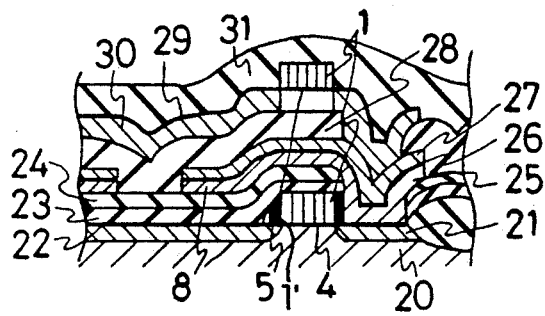
FIGS. 2(a)–2(c) are sectional views taken along A—A', B—B, and C—C' lines in FIG. 1, respectively.
Figure 2B:
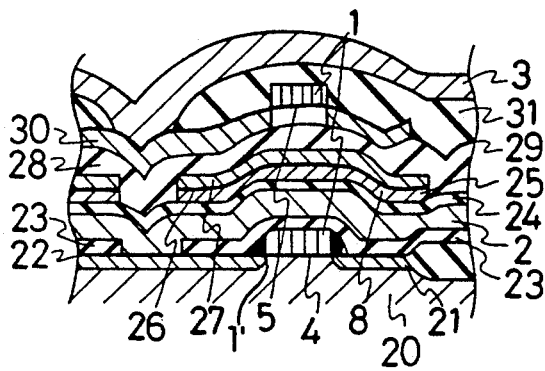
Figure 2C:
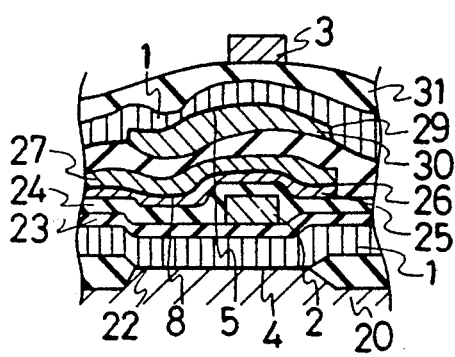

Referring to FIG. 1, a DRAM device includes a word line 1, bit line 2, inversion bit line 3, capacitor 8 and a memory cell 12, the word line 1 and bit lines 2 and 3 being superposed one on another. Referring in general to FIGS. 2(a)-(c) which are sectional views of the DRAM device in FIG. 1, designated by 4 is a first transistor, by 5 a second transistor, by 20 a silicon substrate, by 21 a n+ diffusion layer, by 22 a first gate oxide, by 23 a first insulating film, by 24 a second insulating film, by 25 a capacitor electrode I, by 26 a capacitor insulator, by 27 a capacitor electrode II, by 28 a third insulating film, by 29 a second gate oxide, by 30 a polysilicon layer, and by 31 a fourth insulating film. As shown in these drawings, the DRAM device has a three-dimensional structure vertically stacking the first transistor 4, capacitor 8 and second transistor.

A fabrication procedure of the above DRAM is as follows.

Figure 3A:
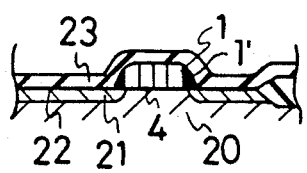
FIGS. 3(a)–3(i) explanatory view illustrating fabrication steps for the embodiment with respect to FIG. 2(a)
Figure 4A:
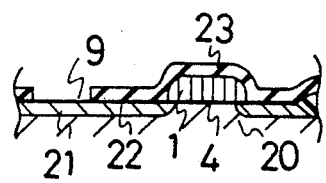
FIGS. 4(a)–4(i) is an explanatory view illustrating the fabrication steps for the embodiment with respect to FIG. 2(b)
Figure 5A:
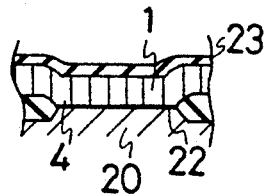
FIGS. 5(a)–5(i) is an explanatory view illustrating the fabrication steps for the embodiment with respect to FIG. 2(c)

Step 1 referring to FIGS. 3(a), 4(a) and 5(a)

The first transistor 4 is formed in accordance with a conventional technique. The first insulating film 23 made of silicon oxide is then deposited by a CVD technique, followed by forming the contact hole 9 by photolithography. The transistor 4 includes the lower word line 1. Sidewalls of the lower word line 1 are bordered by insulators 1'.

Figure 3B:
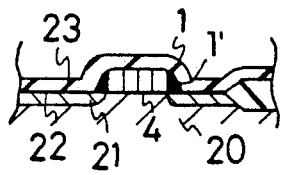
Figure 4B:
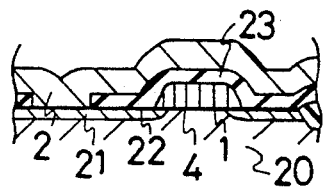
Figure 5B:
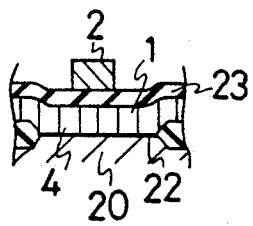

Step 2 referring to FIGS. 3(b), 4(b) and 5(b)

Polysilicon or a polycide is deposited by a CVD technique and is patterned by photolithography to form the bit line 2.

Figure 3C:
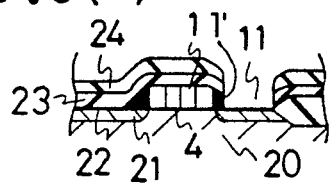
Figure 4C:
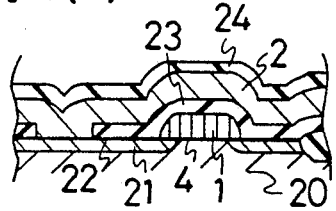
Figure 5C:
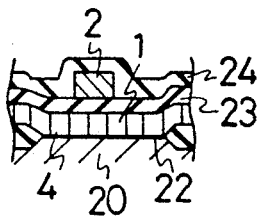

Step 3 referring to FIGS. 3(c), 4(c) and 5(c)

Silicon oxide is deposited by a CVD technique to form the insulating film 24, followed by forming a contact hole 11.

Figure 3D:
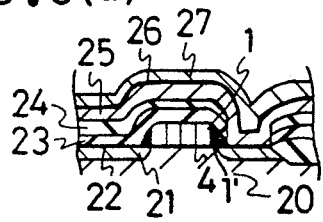
Figure 4D:
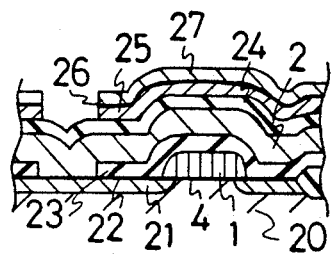
Figure 5D:
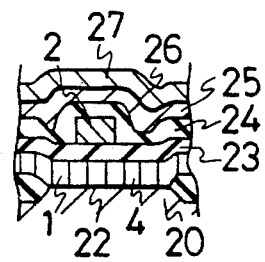

Step 4 referring to FIGS. 3(d), 4(d) and 5(d)

Polysilicon is deposited by a CVD technique. Subsequently, a phosphorus silicate glass film (abbreviated as "PSG film" hereinbelow) is deposited using $POCl_3$ diffused into an oxygen gas, followed by annealing to form a n+ region (first capacitor electrode 25). The capacitor dielectric film 26 is then formed by depositing a silicon nitride and oxidizing it or by depositing $Ta_2O_5$. Polysilicon is deposited again and a PSG film is deposited using $POCl_3$ diffused into an oxygen gas, followed by annealing to form a n+ diffusion region (second capacitor electrode 27). Finally, photolithography is performed to form the capacitor 8.

Figure 3E:
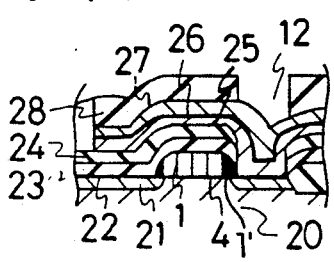
Figure 4E:
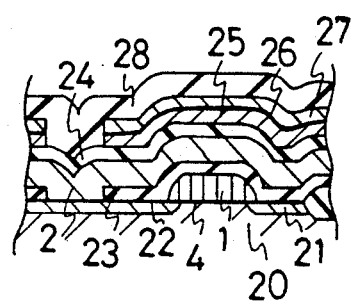
Figure 5E:
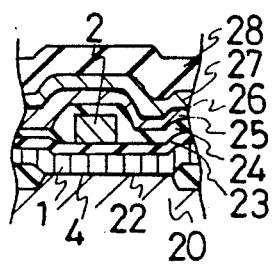

Step 5 referring to FIGS. 3(e), 4(e) and 5(e)

Silicon oxide is deposited by a CVD technique to form the third insulating film 28, followed by forming a contact hole 12 in the third insulating film 28 by etching.

Figure 3F:
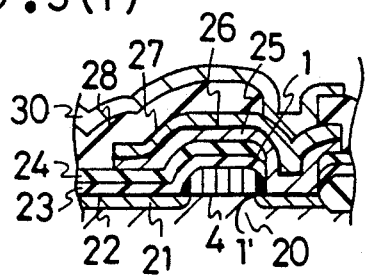
Figure 4F:
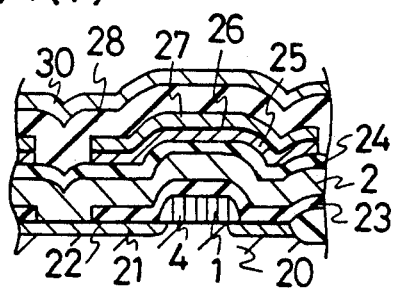
Figure 5F:
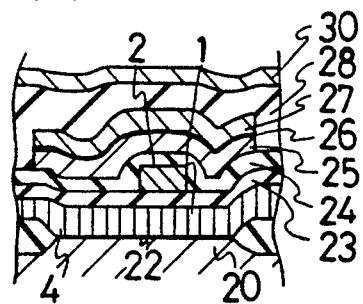

Step 6 referring to FIGS. 3(f), 4(f) and 5(f)

Amorphous silicon is deposited and heated at 600° C. to crystallize, thus forming the polysilicon layer 30.

Figure 3G:
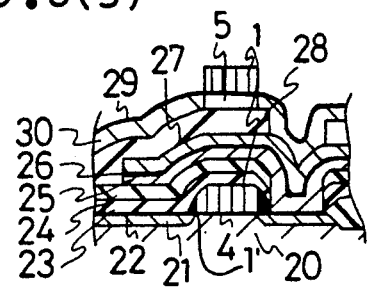
Figure 4G:
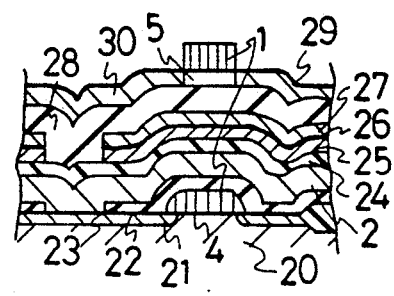
Figure 5G:
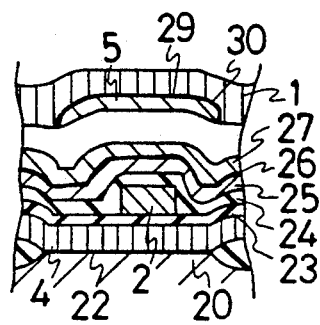

Step 7 referring to FIGS. 3(g), 4(g) and 5(g)

Silicon oxide is deposited by a CVD technique to form the second gate oxide 29, to which B+ions are implanted to form a channel region. Polysilicon is then deposited, and a PSG film is succeedingly deposited on the polysilicon using POCl$_3$ diffused into an oxygen gas, followed by annealing to form a n+diffusion region. The polysilicon layer is etched by photolithography to form the word line. Thereafter, As+ions are implanted to form source/drain regions, thus completing the second transistor 5. The transistor 5 includes the upper word line 1. Sidewalls of the upper word line 1 are bordered by insulators 1'.

Figure 3H:
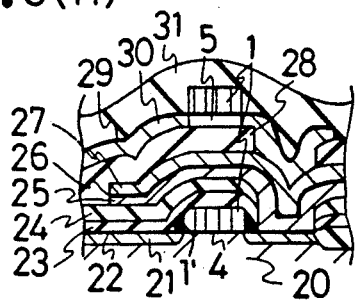
Figure 4H:
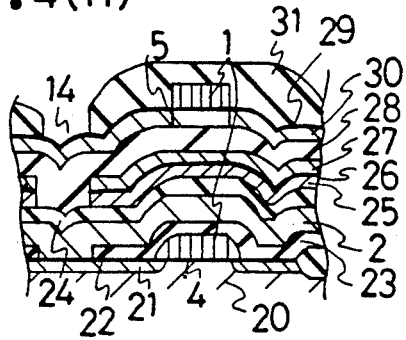
Figure 5H:
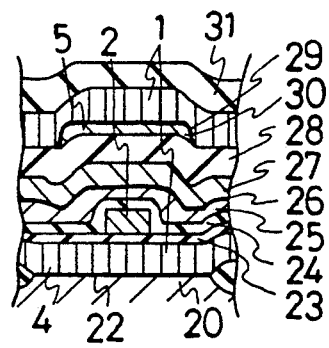

Step 8 referring to FIGS. 3(h), 4(h) and 5(h)

Silicon oxide is deposited by a CVD technique to form the fourth insulating film 31 which is then etched by photolithography to form a contact hole 14 therein.

Figure 3I:
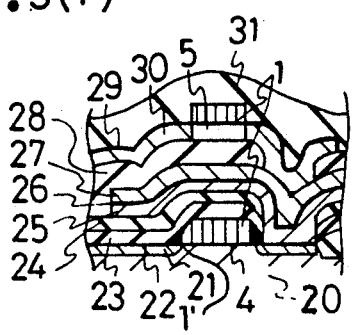
Figure 4I:
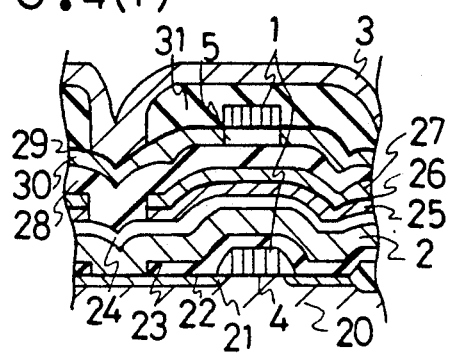
Figure 5I:
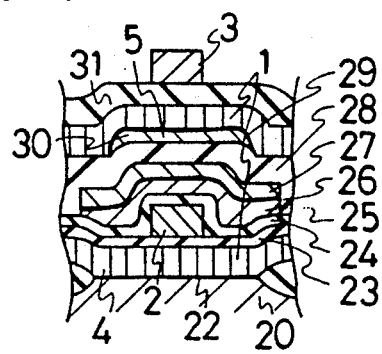
Figure 6:
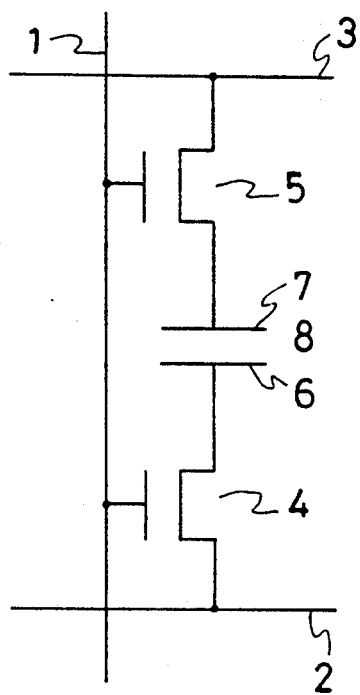
FIG. 6 is an equivalent circuit diagram of a 2-bit memory cell.
Figure 7:
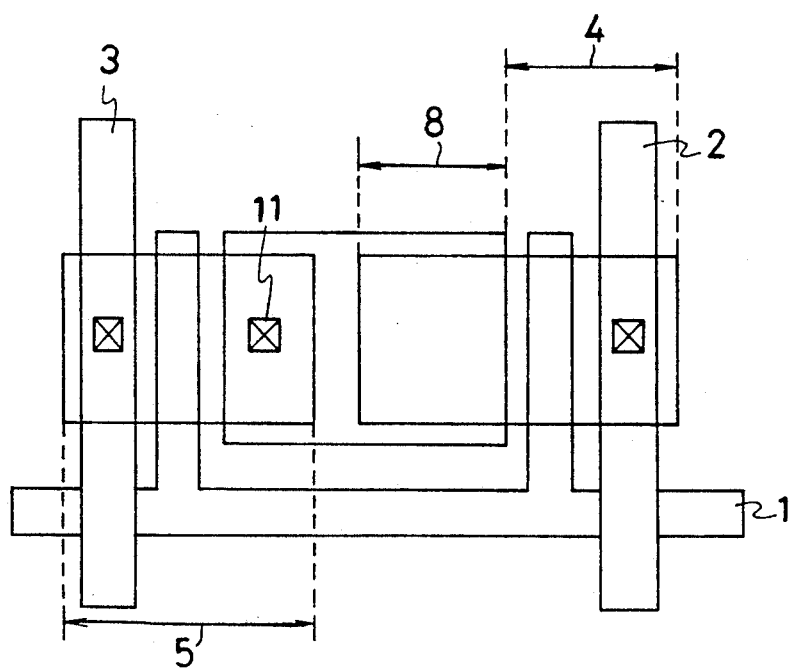
FIG. 7 is a plan view showing a conventional memory cell in which both the two transistors are formed in a substrate.
Figure 8:
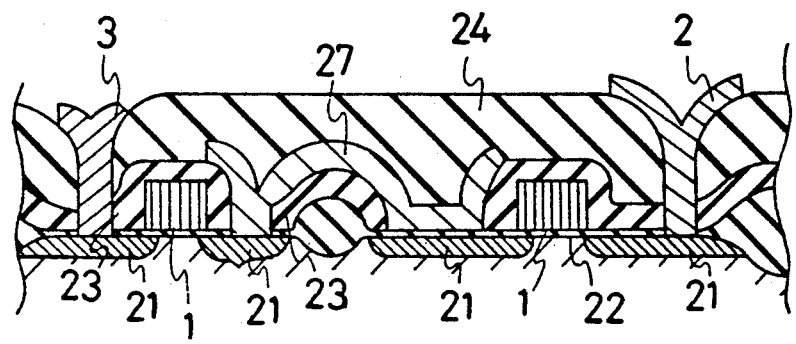
FIG. 8 is a sectional view showing the conventional memory device in FIG. 7.
Figure 9:
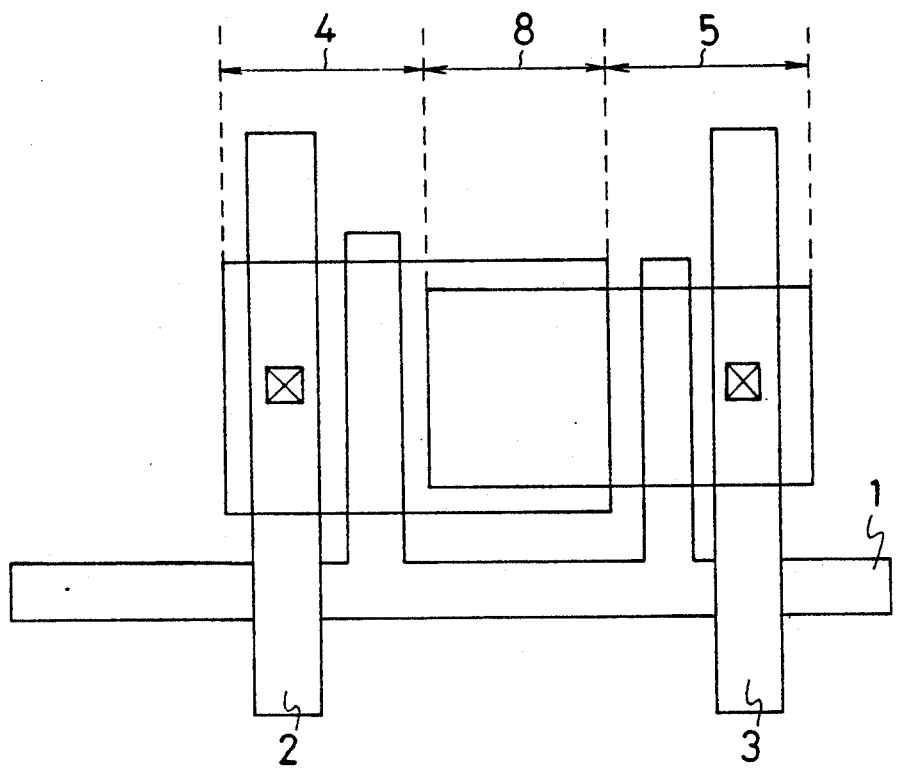
FIG. 9 is a plan view showing another conventional memory device in which one of the two transistors is composed of a thin film transistor.
Figure 10:
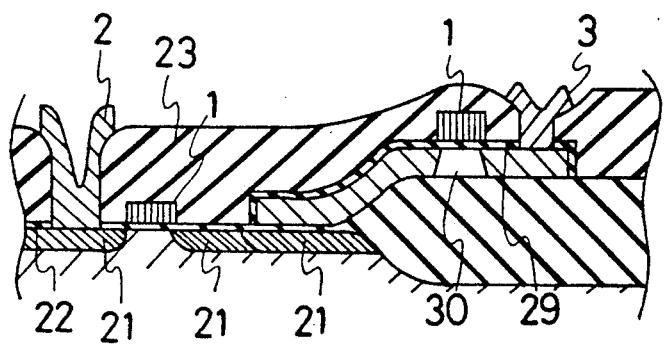
FIG. 10 is a plan view showing the memory device in FIG. 9.

Step 9 referring to FIGS. 3(i), 4(i) and 5(i)

Titanium or tungsten is deposited and then etched by photolithography to form the inversion bit line 3.

As has been described above, the present invention provides a DRAM device in which a transistor formed in the substrate, capacitor and a thin film transistor are vertically stacked. In a vertical direction, the capacitor is disposed between the first or lower word line and the second or upper word line. With this arrangement, an area of a memory cell can be significantly reduced without losing a capacitor area.

While only certain preferred embodiments has been described in detail, as will be apparent with those familiar with the art, certain changes and modifications can be made without departing from the scope of the invention as defined by the following claims.

What is claimed is:

1. A dynamic random access memory device for storing two bit information, the dynamic random access memory device being formed on a silicon substrate and comprising:
    a first access transistor comprised of a first word line formed on the silicon substrate;
    a first bit line making electrical contact with the first access transistor at a first contact region;
    a capacitor, the capacitor comprising:
        a capacitor first electrode disposed above the first access transistor;
        a dielectric film covering the first capacitor electrode; and,
        a capacitor second electrode covering the dielectric film;
    a second access transistor including a second word line;
    a second bit line making electrical contact with the second access transistor at a second contact region;
    wherein in a vertical direction the capacitor is disposed between the first access transistor and the second access transistor, wherein in the vertical direction the first contact region is aligned with the second contact region, and wherein the first word line and the second word line are electrically connected.

2. A dynamic random access memory device for storing two bit information, the dynamic random access memory device being formed on a silicon substrate and comprising:
    a first access transistor, the first access transistor comprising:
        a pair of source/drain regions;
        a channel welled in the silicon substrate;
        a first word line deposited on the silicon substrate;
    a first bit line making electrical contact with the first access transistor at a first contact region;
    a capacitor, the capacitor comprising:
        a capacitor first electrode disposed above the first access transistor and connected to one of the pair of source/drain regions of the first access transistor;
        a dielectric film covering the first capacitor electrode; and,
        a capacitor second electrode covering the dielectric film;
    a second access transistor disposed over the capacitor second electrode, the second access transistor comprising:
        a pair of source/drain regions formed in a polysilicon film and connected to the capacitor second electrode;
        a channel welled in the polysilicon film; and,
        a second word line disposed on the channel of the second access transistor;
    a second bit line making electrical contact with the second access transistor at a second contact region;
    wherein the first access transistor and the second access transistor have the capacitor sandwiched therebetween, wherein in a vertical direction the first contact region is aligned with the second contact region, and wherein the first word line and the second word line are electrically connected.

* * * * *